United States Patent
Liu et al.

(10) Patent No.: US 7,821,103 B2
(45) Date of Patent: Oct. 26, 2010

(54) COUNTER-DOPED VARACTOR STRUCTURE AND METHOD

(75) Inventors: Chun-Li Liu, Scottsdale, AZ (US); Olin K. Hartin, Phoenix, AZ (US); Jay P. John, Chandler, AZ (US); Vishal P. Trivedi, Chandler, AZ (US); James A. Kirchgessner, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 167 days.

(21) Appl. No.: 12/207,127

(22) Filed: Sep. 9, 2008

(65) Prior Publication Data

US 2010/0059860 A1 Mar. 11, 2010

(51) Int. Cl.
H01L 29/93 (2006.01)

(52) U.S. Cl. ............... 257/596; 257/312; 257/595; 257/597; 257/E21.364; 257/E27.049; 257/E29.344; 438/379

(58) Field of Classification Search ................ 438/379; 257/312, 595–597, E21.464, E27.049, E29.344
See application file for complete search history.

(56) References Cited

U.S. PATENT DOCUMENTS

| 6,559,024 | B1 | 5/2003 | Boles et al. | |
|---|---|---|---|---|
| 6,803,269 | B2 | 10/2004 | Coolbaugh et al. | |
| 6,846,729 | B2 * | 1/2005 | Andoh et al. | 438/534 |
| 6,878,983 | B2 | 4/2005 | Coolbaugh et al. | |
| 2004/0032004 | A1 | 2/2004 | Coolbaugh et al. | |
| 2004/0082124 | A1 | 4/2004 | Coolbaugh et al. | |
| 2006/0030114 | A1 | 2/2006 | Yeh et al. | |
| 2006/0145300 | A1 | 7/2006 | Coolbaugh et al. | |
| 2007/0241421 | A1 * | 10/2007 | Liu et al. | 257/510 |

FOREIGN PATENT DOCUMENTS

| EP | 1139434 A2 | 10/2001 |
|---|---|---|
| WO | 2006073943 A2 | 7/2006 |

OTHER PUBLICATIONS

Banerjee et al. ("Simulation and benchmarking of MOS varactors for CMOS090 RF process technology", Motorola S3 2003 Symposium, Itasca, IL, 2003).*

* cited by examiner

*Primary Examiner*—Charles D Garber
*Assistant Examiner*—Yasser A Abdelaziez
(74) *Attorney, Agent, or Firm*—Ingrassia, Fisher & Lorenz, P.C.

(57) ABSTRACT

An improved varactor diode (40) is obtained by providing a substrate (41) having a first surface (43), in which are formed a P+ region (53, 46) proximate the first surface (43), a first N region (54, 45) located beneath the P+ region (53, 46), an N well region (56, 44) located beneath the first N region (54, 45) and a first P counter-doped region (55) located between the first N region (54, 45) and the N well region (56, 44), thereby forming an P+NPN structure for the varactor diode. In some embodiments, a second P-type counter-doped region (59) is provided within the N-well region (56, 44) so as to reduce the N doping concentration within the N well region (56, 44) but without creating a further PN junction therein. The net doping profile (52) provides varactor diodes (40) having a larger tuning ratio than varactors (20) without such counter-doped regions. By interchanging N and P regions an N+PNP varactor is obtained.

21 Claims, 4 Drawing Sheets

US 7,821,103 B2

COUNTER-DOPED VARACTOR STRUCTURE AND METHOD

FIELD OF THE INVENTION

The present invention generally relates to semiconductor (SC) devices and integrated circuits (ICs) and, more particularly, structures and methods for variable capacitance semiconductor devices referred to as "varactors".

BACKGROUND OF THE INVENTION

Varactors are electronic devices, typically although not exclusively semiconductor PN junction devices, whose capacitance varies as a function of the applied voltage. The change in varactor capacitance with applied voltage comes about, for example, when the depletion region of a reverse biased junction widens and narrows with the applied voltage. This change in capacitance with applied voltage can be used to advantage to provide tuning and other functions where a voltage variable capacitance is useful. Varactors are much used for this purpose.

However the usefulness of varactors depends upon a number of factors such as the breakdown voltage, the tuning ratio and the series resistance. If a sufficiently large reverse voltage is applied, the varactor will breakdown or fail in generally the same manner as any semiconductor device. Obviously the maximum tuning voltage that can be applied is limited by the breakdown voltage. Hence, the breakdown voltage needs to be higher than the operating voltage. The tuning ratio (TR=$C_{jv=0}/C_{jv=V}$) is defined as the ratio of the capacitance $C_{jv}$ at one voltage, e.g., v=0 volts, to the capacitance at another voltage, e.g., v=V volts, and is a measure of the amount of capacitance variation that can be usefully obtained. For example, the higher the tuning ratio, the greater the tuning range of an oscillator whose frequency is controlled by a varactor capacitance $C_{jv}$. So, it is desirable that the tuning ratio TR be large. Further, even though the varactor is DC reverse biased and little or no significant DC current flows, it is still carrying AC current so the series resistance contributes to AC losses. Hence, the series resistance of the varactor diode is important since it affects the "Q", or quality factor, of the varactor as a tuning element. The higher the series resistance, the lower the Q.

It is usually the case with present day varactors that changing the device design or construction to improve one or more of the breakdown voltage, tuning ratio, or series resistance can adversely affect the others. Thus, a need continues to exist for improved varactor structures and methods wherein one or more of these factors, especially the tuning ratio, can be improved without adverse effect on the other varactor properties.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
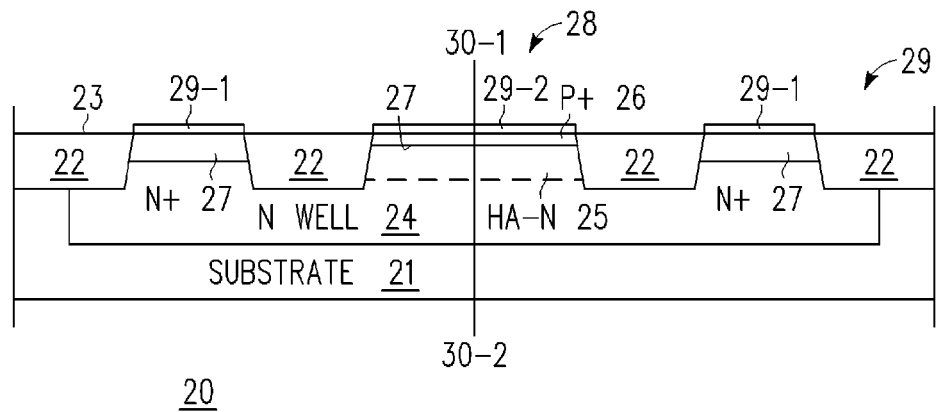
FIG. 1 is a simplified schematic cross-sectional view of a varactor diode according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and including type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting semiconductor-on-insulator (SOI) structures, and combinations thereof. The term "semiconductor" is abbreviated as "SC."

For convenience of explanation and not intended to be limiting, semiconductor devices and methods of fabrication are described herein for silicon semiconductors but persons of skill in the art will understand that other semiconductor materials can also be used. Further, even though the present invention is illustrated for the case of a PN junction varactor diode, those of skill in the art will understand that the present invention applies to any type of device providing a voltage variable capacitance and whose depletion width depends upon the doping profile of the semiconductor and the applied voltage. Non limiting examples are PN junction diodes, metal-semiconductor diodes and hetero-junction diodes. As used herein the term "metal" is intended to include semi-metals, semiconductor-metal alloys and other materials that are relatively more conductive than the associated semiconductor body.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa, whereby for example, an N+PNP structure can be provided in lieu of a P+NPN structure, and so forth. Alternatively, the particular regions illustrated in what follows may be more generally referred to as of a "first conductivity type" and a "second" opposite conductivity type", where the first conductivity type may be either N or P type and the second opposite conductivity type is then either P or N type, and so forth.

FIGS. 1 is a simplified schematic cross-sectional view of varactor diode 20 according to the prior art. Device 20 comprises semiconductor substrate 21 with upper surface 23 having therein dielectric isolation regions 22, N well 24, N+ contact regions 27 with electrical terminals 29-1, and active region 28. Active region 28 comprises hyper-abrupt N doped (abbreviated as "HA-N") region 25 and P+ doped region 26. Electrical terminal 29-2 is provided on P+ doped region 26. HA-N region 25 and P+ region 26 are juxtaposed to form PN junction 27 whose capacitance varies as a function of the reverse bias voltage applied between terminals 29-1 and 29-2. As used herein, the term "hyper-abrupt" with respect to the doping profile of a PN junction is defined as a junction where the doping density on the lower-doped side of the junction drops significantly in a non-linear controlled manner moving away from the metallurgical junction.

Figure 2:
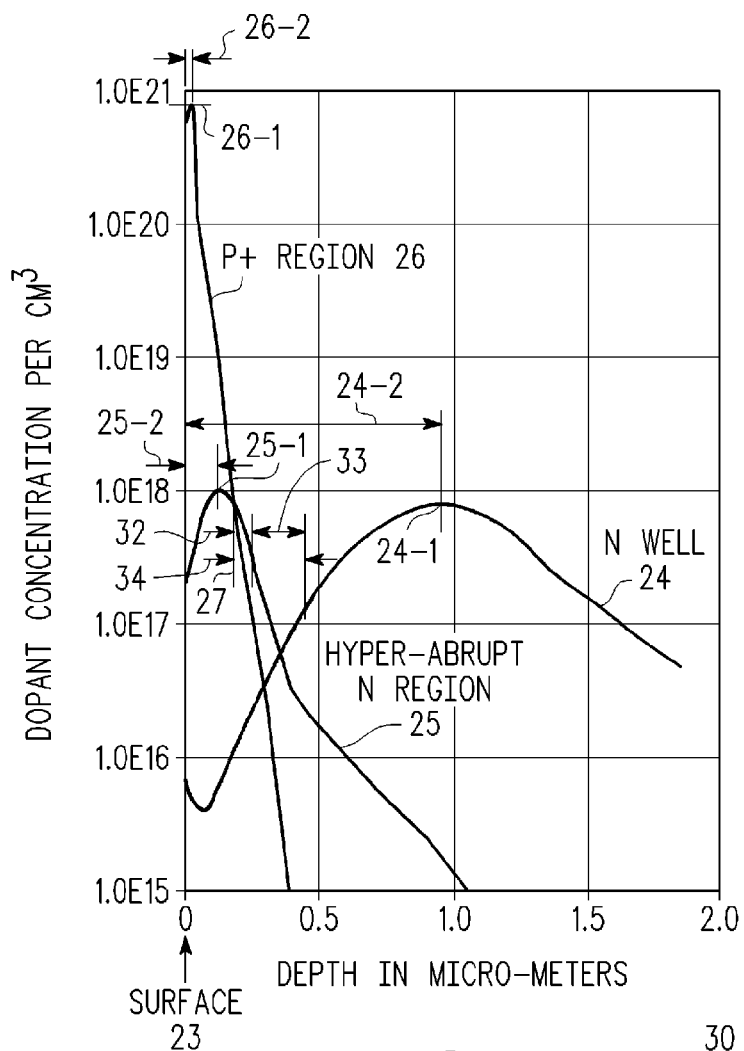
FIG. 2 is a simplified schematic illustration of doping concentration versus depth through the active region of the varactor diode of FIG. 1.

FIG. 2 shows simplified schematic plot 30 of doping concentration versus depth along line 30-1 and 30-2 through active region 28 of varactor diode 20 of FIG. 1. P+ region 26 has peak concentration 26-1 at depth 26-2 from surface 23. N-type hyper-abrupt (HA-N) region 25 has peak concentration 25-1 at depth 25-2 from surface 23 and N well region 24 has peak concentration 24-1 at depth 24-2 from surface 23. PN junction 27 is formed where the doping profiles of P+ region 26 and HA-N region 25 intersect. At zero applied voltage the PN junction depletion region has width 32. At v=V volts (|V|>0) the depletion region has larger width 34. The depletion region width increases by amount 33 at bias voltage V compared to its width at bias voltage zero. Virtually all of width change 33 occurs within HA-N region 25 whose doping drops off rapidly as a function of depth from junction 27.

Figure 3:
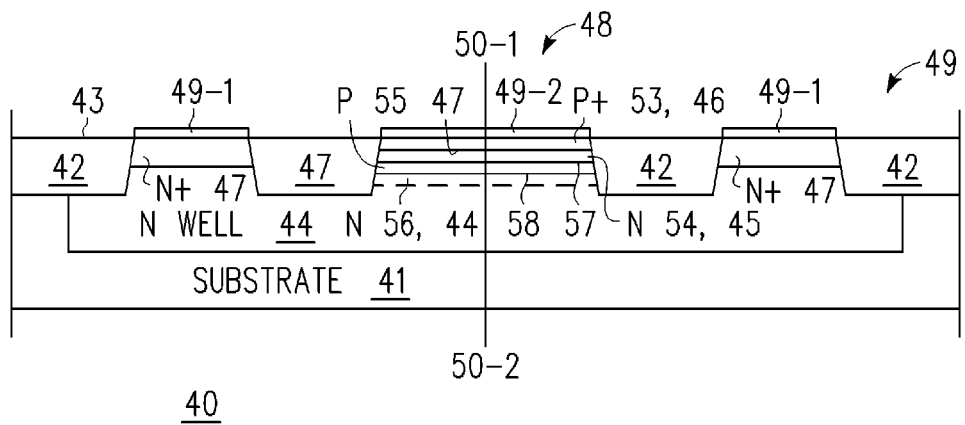
FIG. 3 is a simplified schematic cross-sectional view of a varactor diode according to an embodiment of the present invention.

FIG. 3 is a simplified schematic cross-sectional view of varactor diode 40 according to an embodiment of the present invention. Device 40 comprises semiconductor substrate 41 with upper surface 43 having therein dielectric isolation regions 42, N well region 44, N+ contact regions 47 with electrical terminals 49-1, and active region 48 with electrical terminal 49-2. Dielectric isolation regions 42 are desirable where both contacts to device 40 are desired to be made on a single surface and/or it is desired to provide isolation between device 40 and other devices that may be formed on the same substrate. However, in other embodiments, dielectric isolation regions 42 may be omitted and contacts may be made on other surfaces as well. In still further embodiments, N well region 44 and substrate 41 may be combined. Other well-known methods that are not shown can also be utilized to further reduce the series resistance of N-type region 44 between the electrical terminals 49-1 and PN junction 58. Examples would include an N+ buried layer beneath N well region 44, an N+ buried layer beneath dielectric regions 42 and/or a combination thereof.

Figure 4:
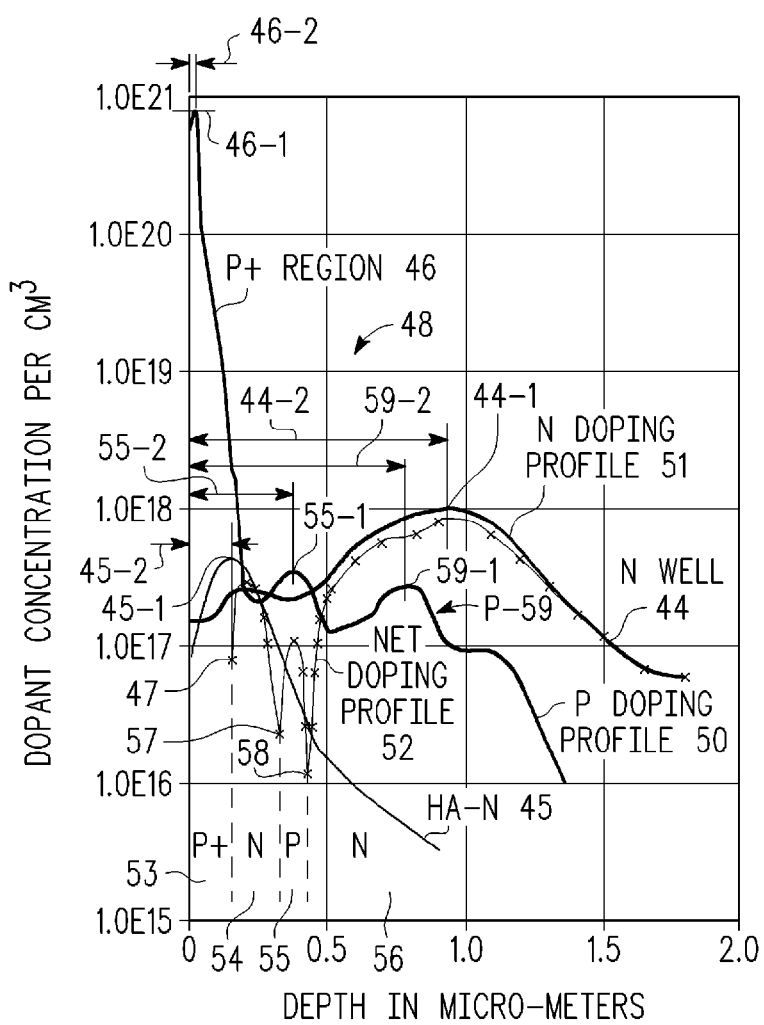
FIG. 4 is a simplified schematic illustration of doping concentration versus depth through the active region of the varactor diode of FIG. 4.

FIG. 4 shows simplified schematic plot 30 of doping concentration versus depth through active region 48 along line 50-1, 50-2 of varactor diode 40 of FIG. 3. Referring now to FIGS. 3 and 4 together, active region 48 of device 40 differs from active region 28 of device 20 in that active region 48 comprises a P+NPN structure, whereas in device 20 active region 28 only involves a single P+N junction. Stated another way, active region 48 includes regions that have been counter-doped to adjust the doping profile as a function of depth in active region 48. In FIG. 4, trace 50 illustrates the P doping profile, trace 51 illustrates the N doping profile and trace 52 illustrates the net doping profile, wherein PN junctions 47, 57, 58 are indicated by the downward extending cusps in net doping profile 52. Progressing inward (to the right in FIG. 4) from surface 43: (i) there is first provided P+ region 53 formed primarily from P+ region 46 having peak concentration 46-1 at depth 46-2 below surface 43, analogous to P+ region 26 of device 20, (ii) then N region 54 formed primarily by hyper-abrupt N doped (HA-N) region 45 analogous to region 25 and with peak concentration 45-1 at depth 45-2 from surface 43 and which forms first PN junction 47 with P+ region 53, (iii) then first P-type counter-doped region 55 having peak concentration 55-1 at depth 55-2 beneath surface 43 and forming second PN junction 57 with N region 54, and (iv) N-type region 56 formed primarily by N well region 44 with peak concentration 44-1 at depth 44-2 from surface 43 and forming third PN junction 58 with P region 55. Electrical terminal 49-2 is provided on P+ region 46 of active region 48. In a further embodiment, second counter-doped P region 59 is provided within N well 44, having peak concentration 59-1 located about at depth 59-2 beneath surface 43. Peak concentration 59-1 is less than the concentration of N well region 44 at depth 59-2, so that an additional PN junction is not formed, but the doping of net doping profile 52 is reduced in the vicinity of depth 59-2 as shown in FIG. 4. Second counter-doped P region 59 is desirable but maybe omitted in other embodiments. For convenience of illustration and to avoid unduly cluttering the drawings, second counter-dope P region 59 is omitted in FIG. 3.

Figure 5:
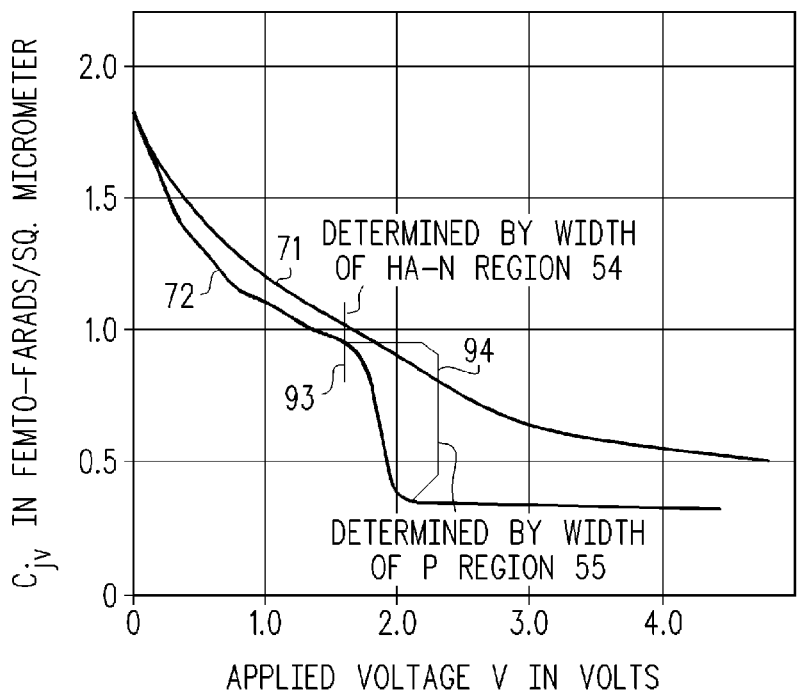
FIG. 5 is a plot of capacitance of varactor diodes of as a function of reverse bias voltage.

FIG. 5 shows plot 70 of capacitance of varactor diodes as a function of reverse bias voltage, wherein trace 71 shows the behavior of device 20 of FIGS. 1-2 and trace 72 shows the behavior of device 40 of FIGS. 3-4. In test devices 20 prepared according to FIGS. 1-2 and whose performance is illustrated in FIG. 5, P+ region 26 was formed by implanting boron at an energy of about 7 KeV and a dose of about 3.5E15 atoms/cm$^2$, HA-N region 25 was formed by implanting arsenic at an energy of about 175 KeV and a dose of about 1.0E13 atoms/cm$^2$, and N well region 24 was formed by implanting phosphorus at an energy range of about 100-1000 KeV and a dose range of about 1.0E12-1.0E14 atoms/cm$^2$. In test devices 40 prepared according to FIGS. 3-4 and whose performance is illustrated in FIG. 5, P+ region 46 was formed by implanting boron at an energy of about 7 KeV and a dose of about 3.5E15 atoms/cm$^2$, HA-N region 45 was formed by implanting arsenic at an energy of about 200 KeV and a dose of about 1E13 atoms/cm$^2$, N well region 44 was formed by implanting phosphorus at an energy range of about 110-600 KeV and a dose range of about 4.0E12-6.0E13 atoms/cm$^2$, first counter-doped P region 55 was formed by implanting boron at an energy of about 110 KeV and a dose of about 8E12 atoms/cm$^2$, and second counter-doped P region 59 was formed by implanting boron at an energy of about 300 KeV and a dose of about 1E13 atoms/cm², but higher and lower energies and higher and lower doses can also be used. It will be noted that the tuning ratio of device 20 (i.e., $TR(20)_{v=2} = C_{jv=0}/C_{jv=2}$) determined from the data of trace 71 of FIG. 5 is about $TR(20)_{v=2} = 2.0$ at about 2 volts and the tuning ratio of device 40 (i.e., $TR(40)_{v=2} = C_{jv=0}/C_{jv=2}$) is about $TR(40)_{v=2} = 5.0$ at about 2 volts, a very significant improvement in tuning ratio at a low applied voltage. Having a large tuning ratio at low voltage is particularly useful in integrated oscillators and other communication devices intended for mobile applications where the power supply voltages are often low, of the order of just a few volts, so that voltage step-up circuits need not be included for actuating the varactor tuning diodes. Corner voltage 93 is determined primarily by the width of HA-N region 54. Region 94 of rapid capacitance change beyond corner voltage 93 is determined primarily by the width of P region 55.

FIGS. 6-11 are simplified cross-sectional views of varactor diode 40 of the type illustrated in FIGS. 3-4 at different stages 101-108 of manufacture according to further embodiments of the present invention. In connection with FIGS. 6-11, various implants are referred to as the preferred doping method. However, other doping means well known in the art may also be used. When doping is by ion implantation, it is conventional to provide a screen oxide or other dielectric on surface 43 to minimize surface damage, but in other embodiments, it may be omitted. Such a screen oxide is not shown in FIGS. 6-11 to avoid cluttering the drawings and obscuring the invention. Also, the masks used in connection with such ion implantation can be photoresist or various hard mask materials such as nitrides, oxides, and/or combinations thereof. Unless otherwise noted, use of photoresist masks is preferred. Further, while the various doping steps are presented in a particular preferred order, this is merely for convenience of explanation and illustration of a preferred sequence but is not intended to be limiting, and in further embodiments, the steps of providing the various doped regions or layers may be carried out in any order.

Figure 6:
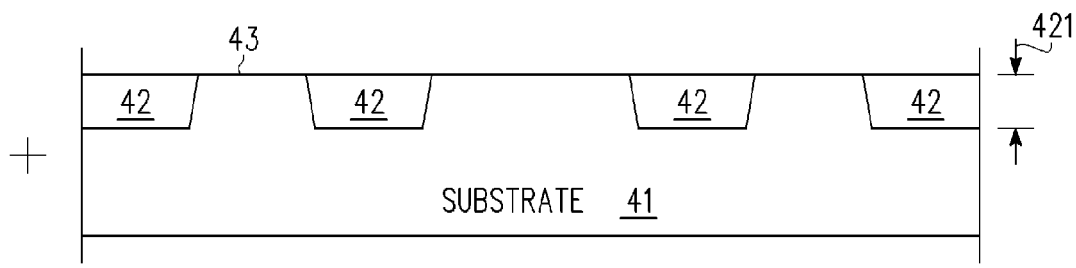
Figure 7:
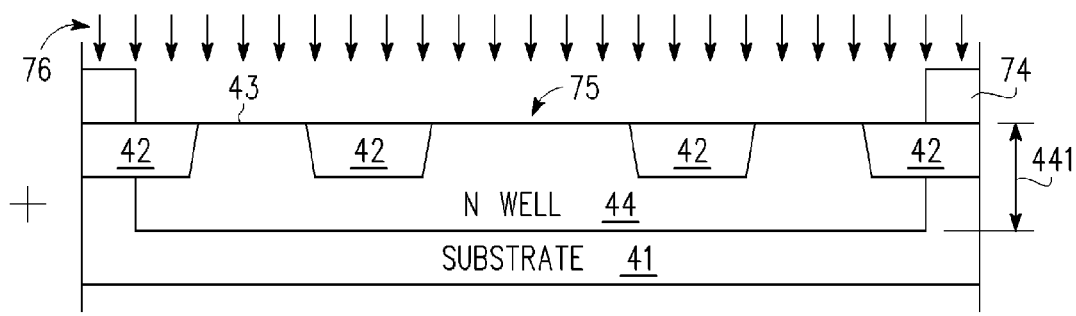

Referring now to manufacturing stage 101 of FIG. 6, substrate 41 is provided having surface 43 in which dielectric isolation regions 42 of depth 421 are provided, using means well known in the art. Dielectric isolation regions 42 are desirable, but may be omitted in other embodiments. Semiconductor substrate 41 is conveniently of P type silicon with a sheet resistance in the range of 10 to 1000 Ohm-cm, but may be of any type of semiconductor and of higher or lower resistivity or sheet resistance. Structure 201 results from manufacturing stage 101. Referring now to manufacturing stage 102 of FIG. 7, mask 74 with opening 75 is provided on surface 43. In a preferred embodiment, N type implant 76 is used to form N well 44 of depth 441 from surface 43, but in other embodiments, other doping means well known in the art may also be used. Implant 76 of, e.g., phosphorous, conveniently has energy in the range of about 100 to 1000 KeV and a dose in the range of about 1.0E12 to 1.0E14 cm⁻², but higher and lower energies may be used depending upon the desired depth of penetration of N well 44 and higher or lower doses may be used depending upon the desired varactor properties and the tolerable series resistance. Structure 202 results. Referring now to manufacturing stage 103 of FIG. 8, mask 74 is removed and replaced with mask 80 having opening 81. In a preferred embodiment, implant 82 is used to form HA-N type region 45 of FIGS. 3-4, with peak concentration 45-1 located at depth 45-2 below surface 43. Implant 82 of, e.g., arsenic, conveniently has energy in the range of about 120 to 250 KeV and dose in the range of about 1.0 E12 to 1.0 E14 cm⁻², but higher and lower energies may be used depending upon the desired depth of penetration of N type region 45 and higher or lower doses may be used depending upon the desired varactor properties. Structure 203 results.

Figure 8:
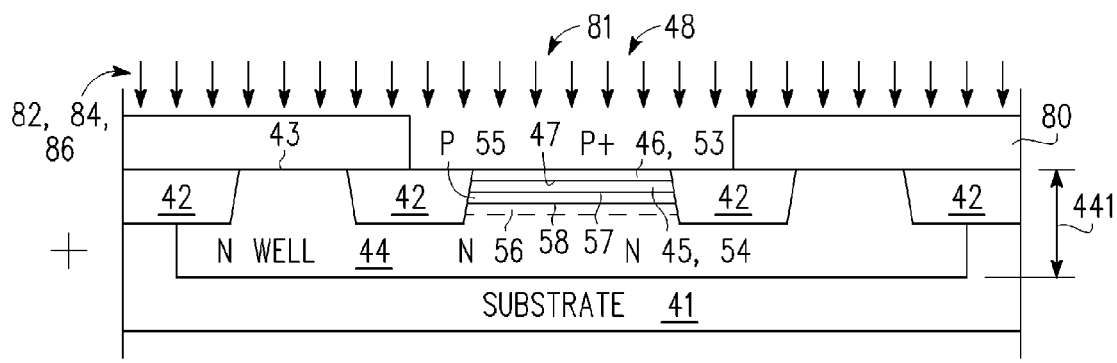

Referring now to manufacturing stage 104 of FIG. 8, mask 80 is retained or in other embodiments, removed and replaced, still having opening 81. In a preferred embodiment, implant 84 is used to form P type region 55 of FIGS. 3-4, with peak concentration 55-1 located at depth 55-2 below surface 43. Implant 84 of e.g., boron, conveniently has energy in the range of about 90 to 200 KeV and a dose in the range of about 1.0E12 to 1.0E14 cm⁻², but higher and lower energies may be used depending upon the desired depth of penetration of P type region 55 and higher or lower doses may be used depending upon the desired varactor properties. In general, depth 55-2 should be less than depth 44-2 and peak concentration 55-1 should be less than peak concentration 45-1 of HA-N region 45. Structure 204 results. Referring now to manufacturing stage 105 of FIG. 8, mask 80 is retained or, in other embodiments, removed and replaced, still having opening 81. In a preferred embodiment, implant 86 is used to form P+ region 46 of FIGS. 3-4, with peak concentration 46-1 (see FIGS. 3-6) located at depth 46-2 just below surface 43. Implant 86 of, e.g., boron, conveniently has energy in the range of about 5 to 10 KeV, preferably about 7 KeV, and a dose in the range of about 1.0E14 to 1.0E16 cm⁻², preferably about 3E15 to 5E15 cm⁻², but higher and lower energies may be used depending upon the desired depth of penetration of P+ type region 46 and higher or lower doses 46-1 may be used depending upon the desired varactor properties. In a further embodiment, P+ region 46, 53 may also be formed by epitaxial growth, preferably selective epitaxial growth, wherein surface 43 refers to the outer surface of epitaxial region 46, 53. In general, P+ region 46, 53 formed by implant 86 (or by epitaxial growth) lies closer to surface 43 than N-type region 54 formed by implant 82 and region 54 formed by implant 82 lies closer to surface 43 than P region 55 formed by implant 84, which in turn lies closer to surface 43 than region 56 formed at least partly by N well 44. P+ type region 46, 53 may also be formed by selective epi growth of a P+ type semiconductor region on active region 48. Accordingly, depending upon the method for formation, P+ type region 46, 53 may be said to be in or on substrate 41. Structure 205 results.

Figure 9:
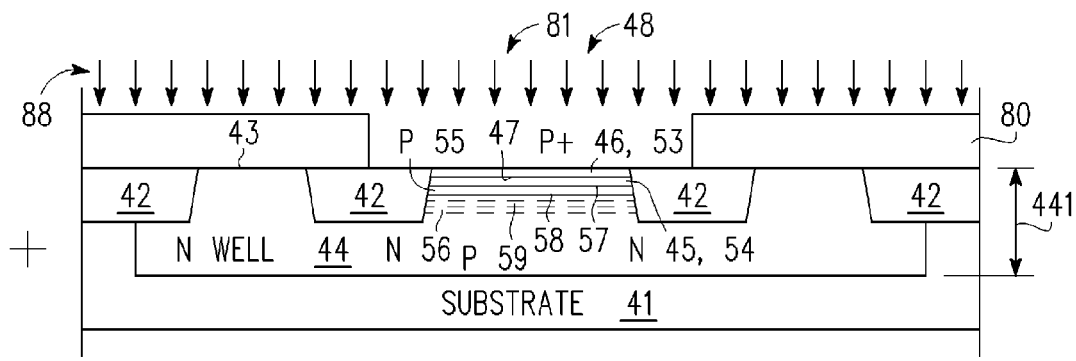

Referring now to manufacturing stage 106 of FIG. 9, mask 80 is retained or, in other embodiments, removed and replaced, still having opening 81. In a preferred embodiment, implant 88 is used to form second counter-doped P region 59 of FIGS. 3-4, with peak concentration 59-1 (see FIG. 4) located at or at depth 59-2 below surface 43. Implant 88 of, e.g., boron, conveniently has energy in the range of about 200 to 400 KeV, preferably about 300 KeV, and a dose in the range of about 1.0E12 to 1.0E14 cm⁻², preferably about 1.0E13 to 2.0E3 cm⁻², but higher and lower energies may be used depending upon the desired depth of penetration 59-2 of P region 59 and higher or lower doses 59-1 may be used depending upon the desired varactor properties. In general, P region 59 formed by implant 88 is intended to partially counter-dope a portion of N well 44 lying near P region 55, and therefore desirably lies closer to surface 43 than depth 44-2 of peak concentration 44-1 of N well region 44 formed by implant 76 but further from surface 43 than region 55 formed by implant 86. In general, peak concentration 59-1 of second counter-doped P region 59 is desirably less than peak concentration 44-1 of N well region 44. Structure 206 results. As noted earlier, implant 88 to form second counter-doped P region 59 is desirable but need not be included in all embodiments.

Figure 10:
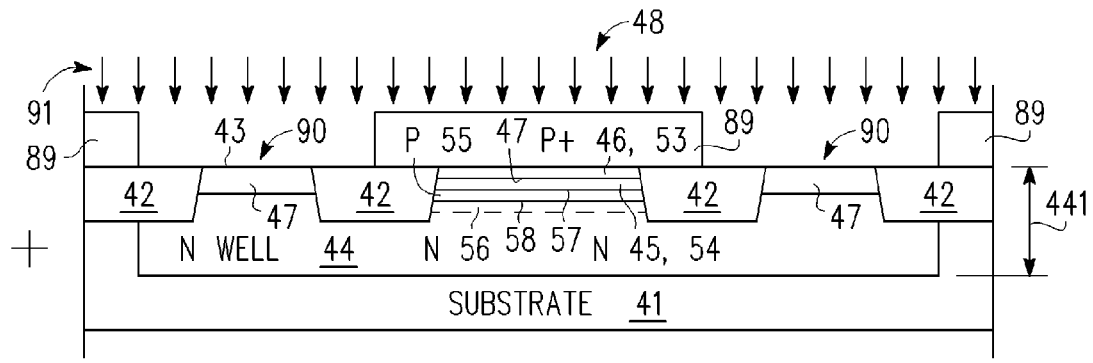
FIGS. 6-11 are simplified cross-sectional views of a varactor diode of the type illustrated in FIGS. 3-4 at different stages of manufacture according to further embodiments of the present invention.

In manufacturing stage 107 of FIG. 10, mask 80 is removed and replaced by mask 89 having openings 90. While two openings 90 are shown in FIG. 10 and this is preferred for device symmetry, any number of openings may be used. In a preferred embodiment, implant 91 is used to form N type contact regions 47 to N well 44. Implant 91 of, e.g., arsenic, conveniently has energy in the range of about 10 to 30 KeV, preferably about 20 KeV, and a dose in the range of about 1E15 to 10E15 $cm^{-2}$, preferably about 4E15 to 6E15 $cm^{-2}$, but higher and lower energies may be used depending upon the desired depth of penetration of N type contact regions 47 and higher or lower doses may be used depending upon the doping of N well 44. Structure 207 results. Alternatively where N well 44 is merged with substrate 41, contact 47 may be formed on the rear face of substrate 41. Either arrangement is useful depending upon what other devices may be integrated in substrate 41.

Figure 11:
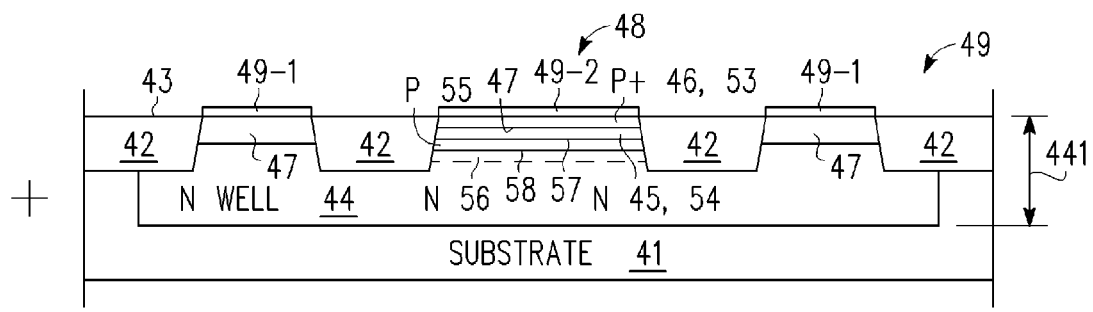

Referring now to manufacturing stage 108 of FIG. 11, mask 89 is desirably removed and silicide electrodes 49-1, 49-2 (collectively 49) provided, respectively, on N+ contact regions 47 coupled to N well 44 and on P+ region 46 on active region 48. Any known method of silicide formation may be used and for silicon semiconductor, silicides such as for example and not intended to be limiting of $TiSi_2$, $CoSi_2$, $NiSi_2$ and others are suitable. $CoSi_2$ is preferred and may be formed, for example, by sputtering 8 to 15 nano-meters of cobalt on surface 43 in argon at about 7 milli-Torr at about 150 degrees Celsius. The sputtered Co layer is annealed at about 450 degrees Celsius for about 60 seconds and then any unreacted Co is removed by blanket etching and the structure further annealed at about 850 degrees Celsius for an additional 60 seconds, but other temperatures, times, metals and etchants may also be used. Structure 208 results wherein, other than for external interconnections, varactor 40 is completed.

Referring again to FIGS. 3-4, it is desirable that the peak concentrations of the various regions have certain relationships. For example and not intended to be limiting, it is desirable that peak concentration 46-1 of P+ region 46 be about 100 to 10000 times, more conveniently about 500 to 1000 times and preferably about 700 to 900 times that of peak concentration 45-1 of HA-N region 45. It is desirable that peak concentration 45-1 of HA-N region 45 be about 1 to 100 times, more conveniently about 1 to 10 times and preferably about 2 to 6 times that of peak concentration 55-1 of first counter-doped P region 55. It is further desirable that peak concentration 55-1 of first counter-doped P region 55 be about 0.01 to 1 times, more conveniently about 0.1 to 1 times and preferably about 0.2 to 0.5 times that of peak concentration 44-1 of N well region 44. It is still further desirable that peak concentration 59-1 of second counter-doped P region 59 be about 0.01 to 0.5 times, more conveniently about 0.05 to 0.5 times and preferably about 0.5 to 0.1 times that of peak concentration 44-1 of N well region 44.

According to further embodiment of the present invention, is desirable that the width between PN junction 47 and NP junction 57 be usefully in the range of about 0.05 to 0.5 micrometers, more conveniently in the range of about 0.05 to 0.3 micrometers and preferably in the range of about 0.1 to 0.2 micrometers. It is further desirable that the width between NP junction 57 and PN junction 58 is usefully in the range of about 0.05 to 0.5 micrometers, more conveniently in the range of about 0.05 to 0.3 micrometers and preferably in the range of about 0.1 to 0.2 micrometers. Stated another way, it is desirable that the width of region 54 between junctions 47 and 57 be equal within a factor of about 1.0 to 1.5 of the width between junction 57 and 58. This will allow the counter-doping peak at the valley of N-WELL profile 51 to maximize the effect of counter-doping and at the same time maintain the effectiveness of hyperabrupt N-type (HA-N) implant 45.

According to a first embodiment, there is provided a varactor diode (40), comprising, a substrate (41) having a first surface (43), a relatively highly doped first region (53, 46) of a first conductivity type and first peak dopant concentration (46-1) in or on the substrate (41) proximate the first surface (43), a second region (54, 45) of a second, opposite conductivity type and second peak dopant concentration (45-1) in the substrate (41) located beneath the first region (53, 46), a third region (56, 44) of the second conductivity type and third peak dopant concentration (44-1) located in the substrate (41) beneath the second region (54, 45), and a fourth counter-doped region (55) of the first conductivity type and fourth peak dopant concentration (55-1) located between the second region (54, 45) and the third region (56, 44), thereby forming a P+NPN or an N+PNP structure for the varactor diode (40). According to a further embodiment, there is further provided a fifth counter-doped region (59) of the first conductivity type within the third region (56, 44) thereby locally reducing net doping of the second conductivity type within a portion of the third region (56, 44) without creating a further PN or NP junction therein. According to a still further embodiment, there is still further provided a relatively highly doped fifth region (47) of the second conductivity type ohmically coupled to the third region (56, 44), thereby forming a P+NPNN+ or N+PNPP+ varactor. According to a yet further embodiment, the second peak dopant concentration (45-1) is about equal to or larger than the fourth peak dopant concentration (55-1). According to a still yet further embodiment, the second peak dopant concentration (45-1) is about 1 to 100 times the fourth peak dopant concentration (55-1). According to aq yet still further embodiment, the second peak dopant concentration (45-1) is about 1 to 10 times the fourth peak dopant concentration (55-1). According to another embodiment, the second peak dopant concentration (45-1) is about 2 to 6 times the fourth peak dopant concentration (55-1). According to a still another embodiment, the fourth peak dopant concentration (55-1) is about less than or equal to the third peak dopant concentration (44-1). According to a yet another embodiment, the fourth peak dopant concentration (55-1) is about 0.01 to 1 times the third peak dopant concentration (44-1).

According to a second embodiment, there is provided a method for forming a varactor diode, comprising, providing a substrate (41) having a first surface (43), then in any order, forming a first region (53, 46) of a first conductivity type and first peak dopant concentration (46-1) in or on the substrate (41) proximate the first surface (43), providing a second region (54, 45) of a second, opposite conductivity type and second peak dopant concentration (45-1) in the substrate (41) located beneath the first region (53, 46), forming a third region (56, 44) of the second conductivity type and third peak dopant concentration (44-1) located in the substrate (41) beneath the second region (54, 45), providing a fourth counter-doped region (55) of the first conductivity type and fourth peak dopant concentration (55-1) located at a depth (55-2) between a depth (45-2) of the peak concentration (45-1) of the second region (54, 45) and a depth (44-2) of the peak concentration (44-1) of the third region (56, 44), thereby forming a P+NPN or N+PNP structure for the varactor diode (40). According to a further embodiment, the method further comprises forming a fifth counter-doped region (59) of the first conductivity type within the third region (56, 44) thereby locally reducing net doping of the second conductivity type within a portion of the third region (56, 44) without creating a further PN or NP junction therein. According to a still further embodiment, the first region (53, 46) forms a first PN or NP junction (47) with the second region (54, 45) and the second region (54, 45) forms a second NP or PN junction (57) with the fourth region (55) and the first PN or NP junction (47) is separated from the second NP or PN junction (57) by about 0.05 to 0.5 micrometers. According to a yet further embodiment, the fourth region (55) and the first PN or NP junction (47) is separated from the second NP or PN junction (57) by about 0.05 to 0.3 micrometers. According to a still yet further embodiment, the fourth region (55) and the first PN or NP junction (47) is separated from the second NP or PN junction (57) by about 0.1 to 0.2 micrometers. According to an other embodiment, the first region (53, 46) forms a first PN or NP junction (47) with the second region (54, 45) and the second region (54, 45) forms a second NP or PN junction (57) with the fourth region (55) and the fourth region (55) forms a third PN or NP junction (58) with the third region (56, 44), and the first PN or NP junction (47) is separated from the second NP or PN junction (57) by a first distance and the second NP or PN junction (57) is separated from the third PN or NP junction (58) by a second distance, and the first distance is equal to the second distance within a factor of about 1.0 to 1.5. According to a still another embodiment, the first region (53, 46) is formed by epitaxial growth.

According to a third embodiment, there is provided a varactor diode (40), comprising, a substrate (41) having a first surface (43), a P+ region (53, 46) in or on the substrate (41) proximate the first surface (43), a first N region (54, 45) in the substrate (41) located beneath the P+ region (53, 46), an N well region (56, 44) located in the substrate beneath the first N region (54, 45), and a first P type counter-doped region (55) located between the first N region (54, 45) and the N well region (56, 44), thereby forming a P+NPN structure for the varactor diode (40). According to a further embodiment, the diode further comprises a second counter doped region (59) located within the N well region (56, 44) so as to reduce the net doping within a portion of the N well region (56, 44) without forming a further PN or NP junction therein. According to a still further embodiment, a first PN junction (47) is formed between the P+ region (53, 46) and the first N region (54, 45) and a second NP junction (57) is formed between the first N region (54, 45) and the first P type counter doped region (55) and a third PN junction (58) is formed between the first P type counter doped region (55) and the N well region (56, 44). According to a yet further embodiment, the first (47) and second (48) PN or NP junctions are separated by a first distance and the second (48) and third (48) NP or PN junctions are separated by a second distance and the first and second distances are equal within a factor of about 1.5 or less. According to a still yet further embodiment, N and P type conductivities are interchanged, so that P type becomes N type and N type becomes P type, thereby forming an N+PNP structure for the varactor diode (40).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A varactor diode, comprising:
   a substrate having a first surface;
   a relatively highly doped first region of a first conductivity type and first peak dopant concentration in or on the substrate proximate the first surface;
   a second region of a second, opposite conductivity type and second peak dopant concentration in the substrate located beneath the first region;
   a third region of the second conductivity type and third peak dopant concentration located in the substrate beneath the second region; and
   a fourth counter-doped region of the first conductivity type and fourth peak dopant concentration located between the second region and the third region, thereby forming a P+NPN or an N+PNP structure for the varactor diode.

2. The varactor diode of claim 1, further comprising, a fifth counter-doped region of the first conductivity type within the third region thereby locally reducing net doping of the second conductivity type within a portion of the third region without creating a further PN or NP junction therein.

3. The varactor diode of claim 1, further comprising a relatively highly doped fifth region of the second conductivity type ohmically coupled to the third region, thereby forming a P+NPNN+ or N+PNPP+ varactor.

4. The varactor diode of claim 1, wherein the second peak dopant concentration is about equal to or larger than the fourth peak dopant concentration.

5. The varactor diode of claim 4, wherein the second peak dopant concentration is about 1 to 100 times the fourth peak dopant concentration.

6. The varactor diode of claim 5, wherein the second peak dopant concentration is about 1 to 10 times the fourth peak dopant concentration.

7. The varactor diode of claim 6, wherein the second peak dopant concentration is about 2 to 6 times the fourth peak dopant concentration.

8. The varactor diode of claim 1, wherein the fourth peak dopant concentration is about less than or equal to the third peak dopant concentration.

9. The varactor diode of claim 8, wherein the fourth peak dopant concentration is about 0.01 to 1 times the third peak dopant concentration.

10. A method for forming a varactor diode, comprising:
    providing a substrate having a first surface, then in any order;
    forming a first region of a first conductivity type and first peak dopant concentration in or on the substrate proximate the first surface;
    providing a second region of a second, opposite conductivity type and second peak dopant concentration in the substrate located beneath the first region;
    forming a third region of the second conductivity type and third peak dopant concentration located in the substrate beneath the second region; and
    providing a fourth counter-doped region of the first conductivity type and fourth peak dopant concentration located at a depth between a depth of the peak concentration of the second region and a depth of the peak concentration of the third region, thereby forming a P+NPN or N+PNP structure for the varactor diode.

11. The method of claim 9, further comprising, forming a fifth counter-doped region of the first conductivity type within the third region thereby locally reducing net doping of the second conductivity type within a portion of the third region without creating a further PN or NP junction therein.

12. The method of claim 10, wherein the first region forms a first PN or NP junction with the second region and the second region forms a second NP or PN junction with the fourth region and the first PN or NP junction is separated from the second NP or PN junction by about 0.05 to 0.5 micrometers.

13. The method of claim 12, wherein the fourth region and the first PN or NP junction is separated from the second NP or PN junction by about 0.05 to 0.3 micrometers.

14. The method of claim 13, wherein the fourth region and the first PN or NP junction is separated from the second NP or PN junction by about 0.1 to 0.2 micrometers.

15. The method of claim 10, wherein the first region forms a first PN or NP junction with the second region and the second region forms a second NP or PN junction with the fourth region and the fourth region forms a third PN or NP junction with the third region, and the first PN or NP junction is separated from the second NP or PN junction by a first distance and the second NP or PN junction is separated from the third PN or NP junction by a second distance, and the first distance is equal to the second distance within a factor of about 1.0 to 1.5.

16. The method of claim 10, wherein the first region is formed by epitaxial growth.

17. A varactor diode, comprising:
a substrate having a first surface;
a P+ region in or on the substrate proximate the first surface;
a first N region in the substrate located beneath the P+ region;
an N well region located in the substrate beneath the first N region; and
a first P type counter-doped region located between the first N region and the N well region, thereby forming a P+NPN structure for the varactor diode.

18. The varactor diode of claim 17, further comprising a second counter doped region located within the N well region so as to reduce the net doping within a portion of the N well region without forming a further PN or NP junction therein.

19. The varactor diode of claim 17, wherein a first PN junction is formed between the P+ region and the first N region and a second NP junction is formed between the first N region and the first P type counter doped region and a third PN junction is formed between the first P type counter doped region and the N well region.

20. The varactor diode of claim 19, wherein the first and second PN or NP junctions are separated by a first distance and the second and third NP or PN junctions are separated by a second distance and the first and second distances are equal within a factor of about 1.5 or less.

21. The varactor diode of claim 17, wherein N and P type conductivities are interchanged, so that P type becomes N type and N type becomes P type, thereby forming an N+PNP structure for the varactor diode.

* * * * *